(12) United States Patent
Tokranov et al.

(10) Patent No.: US 12,433,014 B2
(45) Date of Patent: Sep. 30, 2025

(54) STRUCTURE HAVING DIFFERENT GATE DIELECTRIC WIDTHS IN DIFFERENT REGIONS OF SUBSTRATE

(71) Applicant: GlobalFoundries U.S. Inc., Malta, NY (US)

(72) Inventors: Anton V. Tokranov, Halfmoon, NY (US); Hong Yu, Clifton Park, NY (US); Edward P. Reis, Jr., Ballston Spa, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 608 days.

(21) Appl. No.: 17/658,914

(22) Filed: Apr. 12, 2022

(65) Prior Publication Data

US 2023/0326924 A1    Oct. 12, 2023

(51) Int. Cl.
*H10D 84/83* (2025.01)
*H10D 64/27* (2025.01)
(Continued)

(52) U.S. Cl.
CPC .......... *H10D 84/83* (2025.01); *H10D 64/514* (2025.01); *H10D 84/0144* (2025.01); *H10D 84/038* (2025.01)

(58) Field of Classification Search
CPC ... H01L 21/823857; H01L 29/517–518; H01L 21/02142–02161; H01L 21/0214;
(Continued)

(56) References Cited

U.S. PATENT DOCUMENTS 6,051,881 A * 4/2000 Klein ................ H01L 21/76895
257/E23.168
6,933,226 B2 * 8/2005 Lee ...................... H10D 64/017
438/692

(Continued)

OTHER PUBLICATIONS

Sha et al., "Ion-enhanced chemical etching of HfO2 for integration in metal-oxide-semiconductor field effect transistors," J. Vac. Sci. Technol. 21:2420-27, Nov./Dec. 2003.

*Primary Examiner* — Maliheh Malek
(74) *Attorney, Agent, or Firm* — Francois Pagette; Hoffman Warnick LLC

(57) ABSTRACT

A structure and method of forming different high dielectric constant (high-K) gate dielectrics for different transistors on the same substrate, are disclosed. A first region includes a first transistor(s) on the substrate having a first gate structure having a first gate body over a first high-K gate dielectric. The first gate body and the first high-K gate dielectric have different widths defining a first width difference. A second region includes a second transistor(s) on the substrate having a second gate structure having a second gate body over a second high-K gate dielectric. The second gate body and the second high-K gate dielectric have different widths defining a second width difference. The first width difference is different than the second width difference, i.e., amongst transistors in the different regions. The different gate dielectric widths improve control of overlap capacitance of the transistors without increasing dopants or an annealing temperature.

14 Claims, 11 Drawing Sheets

(51) Int. Cl.
*H10D 84/01* (2025.01)
*H10D 84/03* (2025.01)

(58) Field of Classification Search
CPC ......... H01L 21/0217; H01L 21/02321–02332; H01L 21/02175–02194; H01L 21/823462; H01L 29/42368; H01L 29/42364
See application file for complete search history.

(56) References Cited

U.S. PATENT DOCUMENTS

| | | | | |
|---|---|---|---|---|
| 7,217,985 B2* | 5/2007 | Kim | ............... | H10D 84/83 257/500 |
| 7,329,570 B2* | 2/2008 | Lee | ............... | H10D 84/038 257/370 |
| 7,696,048 B2* | 4/2010 | Kwon | ............... | H10B 10/12 438/303 |
| 7,932,143 B1* | 4/2011 | Pal | ............... | H10D 64/665 438/296 |
| 7,952,140 B2* | 5/2011 | Jang | ............... | H10B 12/50 257/331 |
| 8,048,790 B2* | 11/2011 | Soss | ............... | H01L 21/76897 438/585 |
| 8,193,099 B1* | 6/2012 | Khare | ............... | H10D 84/038 257/E21.309 |
| 8,269,281 B2* | 9/2012 | Park | ............... | H10D 84/0144 257/365 |
| 8,669,618 B2* | 3/2014 | Fu | ............... | H10D 64/017 438/479 |
| 8,673,731 B2* | 3/2014 | Chang | ............... | H10D 86/201 438/289 |
| 8,877,625 B1* | 11/2014 | Lian | ............... | H10D 84/038 257/327 |
| 8,878,301 B2* | 11/2014 | Hirano | ............... | H10D 84/0142 257/369 |
| 8,951,855 B2* | 2/2015 | Lai | ............... | H10D 64/017 438/199 |
| 9,324,577 B2* | 4/2016 | Chiang | ............... | H01L 21/32138 |
| 9,564,369 B1* | 2/2017 | Kim | ............... | H01L 21/32134 |
| 9,698,264 B2* | 7/2017 | Kim | ............... | H10D 64/518 |
| 9,780,092 B2* | 10/2017 | Chang | ............... | H10D 84/0193 |
| 9,871,063 B1* | 1/2018 | Oh | ............... | H10D 30/608 |
| 10,050,033 B1* | 8/2018 | Thei | ............... | H10D 84/0172 |
| 10,600,882 B2* | 3/2020 | Hung | ............... | H10D 64/518 |
| 10,818,594 B2* | 10/2020 | Ema | ............... | H10D 30/697 |
| 11,158,644 B2* | 10/2021 | Wu | ............... | G11C 16/0441 |
| 12,027,520 B2* | 7/2024 | Yuu | ............... | H10D 84/83 |
| 2002/0076867 A1* | 6/2002 | Lee | ............... | H10D 64/017 438/693 |
| 2002/0130314 A1* | 9/2002 | Yim | ............... | H10D 30/69 257/E21.691 |
| 2002/0163039 A1 | 11/2002 | Clevenger et al. | | |
| 2004/0150066 A1* | 8/2004 | Inoue | ............... | H10D 84/0184 257/E21.624 |
| 2004/0212019 A1* | 10/2004 | Shinohara | ............... | H10B 43/30 257/E21.679 |
| 2005/0194648 A1* | 9/2005 | Kim | ............... | H10D 84/0144 257/390 |
| 2005/0227440 A1* | 10/2005 | Ema | ............... | H10D 84/811 257/E21.639 |
| 2005/0280000 A1* | 12/2005 | Ishii | ............... | H10D 84/0144 257/E21.624 |
| 2007/0138571 A1* | 6/2007 | Nakabayashi | ......... | H10B 12/09 257/E21.624 |
| 2007/0290236 A1* | 12/2007 | Sasaki | ............... | H10D 84/184 257/E21.205 |
| 2008/0036008 A1* | 2/2008 | Hirase | ............... | H10D 84/0151 257/E21.639 |
| 2008/0036014 A1* | 2/2008 | Akamatsu | ............... | H10D 84/038 257/E27.098 |
| 2010/0109056 A1* | 5/2010 | Pal | ............... | H01L 21/28247 257/288 |
| 2011/0121397 A1* | 5/2011 | Pal | ............... | H10D 64/667 257/E29.264 |
| 2012/0139061 A1* | 6/2012 | Ramachandran | ...... | H10D 30/60 438/586 |
| 2013/0149854 A1* | 6/2013 | Ishii | ............... | H10D 84/0133 438/587 |
| 2014/0048882 A1* | 2/2014 | Chang | ............... | H10D 86/01 257/E27.06 |
| 2014/0103403 A1* | 4/2014 | Kim | ............... | H10D 84/0149 257/288 |
| 2015/0069524 A1* | 3/2015 | Hong | ............... | H10D 86/201 438/587 |
| 2015/0228645 A1* | 8/2015 | Chuang | ............... | H01L 21/02529 438/290 |
| 2015/0228646 A1* | 8/2015 | Ho | ............... | H01L 21/31051 438/586 |
| 2015/0262825 A1* | 9/2015 | Chen | ............... | H10D 84/038 438/587 |
| 2016/0027893 A1* | 1/2016 | Kwon | ............... | H10D 84/038 257/411 |
| 2016/0300908 A1* | 10/2016 | Heo | ............... | H10D 30/675 |
| 2017/0243869 A1* | 8/2017 | Chang | ............... | H10D 84/834 |
| 2017/0271513 A1* | 9/2017 | Yamaguchi | ......... | H10D 30/794 |
| 2018/0315661 A1* | 11/2018 | Chuang | ............... | H10D 84/859 |
| 2019/0027487 A1* | 1/2019 | Chen | ............... | H01L 21/28518 |
| 2020/0020598 A1* | 1/2020 | Cheng | ............... | H10D 30/0275 |
| 2020/0027964 A1* | 1/2020 | Cheng | ............... | H10D 84/856 |
| 2020/0273752 A1* | 8/2020 | Olac-Vaw | ............... | H10D 64/667 |
| 2020/0303508 A1* | 9/2020 | Yun | ............... | H01L 23/5283 |
| 2021/0134979 A1* | 5/2021 | Pan | ............... | H10D 30/0413 |
| 2022/0102531 A1* | 3/2022 | Fu | ............... | H01L 21/31058 |
| 2022/0208793 A1* | 6/2022 | Takahata | ............... | H10D 30/6755 |
| 2022/0278209 A1* | 9/2022 | Mine | ............... | H10D 64/252 |
| 2022/0302306 A1* | 9/2022 | Tailor | ............... | H10D 84/0177 |
| 2022/0328356 A1* | 10/2022 | Chang | ............... | H10D 30/62 |
| 2022/0359690 A1* | 11/2022 | Iwata | ............... | H10D 64/01 |
| 2023/0215731 A1* | 7/2023 | Tailor | ............... | H10D 30/603 |
| 2023/0299083 A1* | 9/2023 | Hwang | ............... | H10D 64/514 |

\* cited by examiner

STRUCTURE HAVING DIFFERENT GATE DIELECTRIC WIDTHS IN DIFFERENT REGIONS OF SUBSTRATE

BACKGROUND

The present disclosure relates to integrated circuits, and more particularly, to structure including transistors in different regions of a substrate having gate structures for transistors having different high dielectric constant (high-K) gate dielectric widths.

Increasing direct current and radio frequency performance in certain integrated circuit structures is advantageous. One way to achieve this increase in performance is to increase overlap capacitance ($C_{ov}$), which is generally the on-capacitance of the device. Increasing doping of the substrate with a corresponding increase in drive-in temperature is one mechanism to achieve the increased $C_{ov}$, but this approach disadvantageously results in increased threshold voltage variability.

SUMMARY

An aspect of the disclosure is directed to a structure, comprising: a substrate; a first region including at least one first transistor on the substrate, the at least one first transistor having a first gate structure having a first gate body over a first high dielectric constant (high-K) gate dielectric, wherein the first gate body and the first high-K gate dielectric have different widths defining a first width difference; and a second region including at least one second transistor on the substrate, the at least one second transistor having a second gate structure having a second gate body over a second high-K gate dielectric, wherein the second gate body and the second high-K gate dielectric have different widths defining a second width difference, and wherein the first width difference is different than the second width difference.

An aspect of the disclosure relates to a structure, comprising: a substrate; and a plurality of regions on the substrate, each region including at least one transistor on the substrate, each transistor in a selected region having a gate structure having a gate body over a high dielectric constant (high-K) gate dielectric, wherein the gate body and the high-K gate dielectric have different widths defining a width difference, and wherein the width difference is different for the respective at least one transistor in each region of the plurality of regions.

Another aspect of the disclosure is directed to a method, comprising: forming at least one first gate structure in a first region of a substrate, each first gate structure having a first gate body over a first high dielectric constant (high-K) gate dielectric, wherein the first gate body and the first high-K gate dielectric have different widths defining a first width difference; and forming at least one second gate structure in a second region of the substrate, each second gate structure having a second gate body over a second high-K gate dielectric, wherein the second gate body and the second high-K gate dielectric have different widths defining a second width difference, and wherein the first width difference is different than the second width difference.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
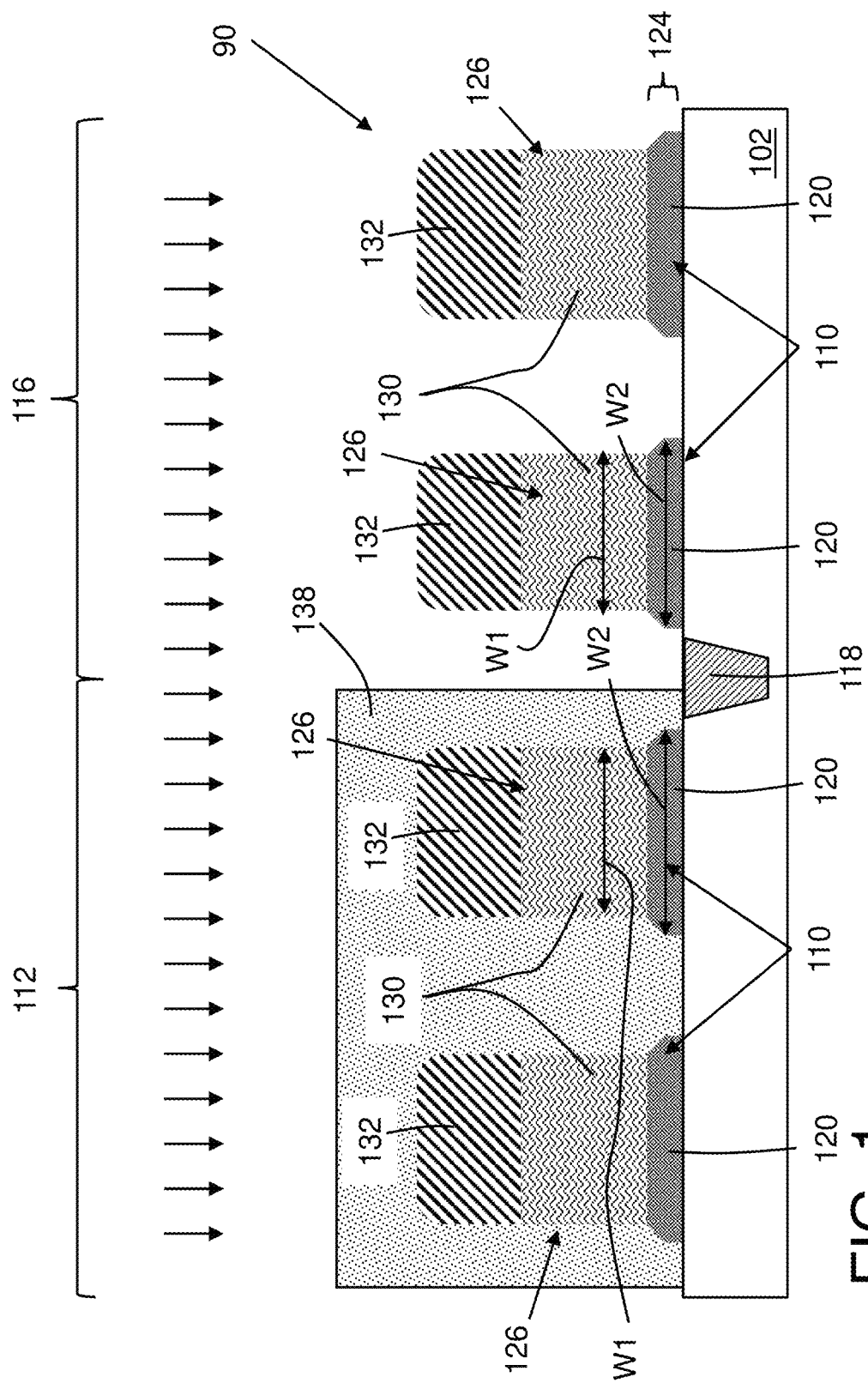
FIG. 1 shows a cross-sectional view of an initial structure for a method, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a structure and method of forming different width high dielectric constant (high-K) gate dielectrics for different transistors on the same substrate. A structure includes a substrate, and a first region including at least one first transistor on the substrate. The first transistor(s) has a first gate structure having a first gate body over a first high-K gate dielectric. The first gate body and the first high-K gate dielectric have different widths defining a first width difference. The structure also includes a second region including at least one second transistor on the substrate. The second transistor(s) have a second gate structure having a second gate body over a second high-K gate dielectric. The second gate body and the second high-K gate dielectric have different widths defining a second width difference. The first width difference is different than the second width difference, i.e., amongst transistors in the different regions. The method uses a mask with or without a spacer layer on the gate structures combined with an etch, i.e., over or under etch, of the high-K dielectrics to form the structure. The different gate dielectric widths in the different regions allow for better control of overlap capacitance ($C_{ov}$) of the different transistors without increasing dopants or a drive-in annealing temperature therefor. The disclosure thus avoids increasing threshold voltage variability of devices across the substrate.

In the description that follows, the widths of elements are measured at a lowermost extent thereof regardless of location of width indicators (double arrows) therefor in the drawings.

Figure 2:
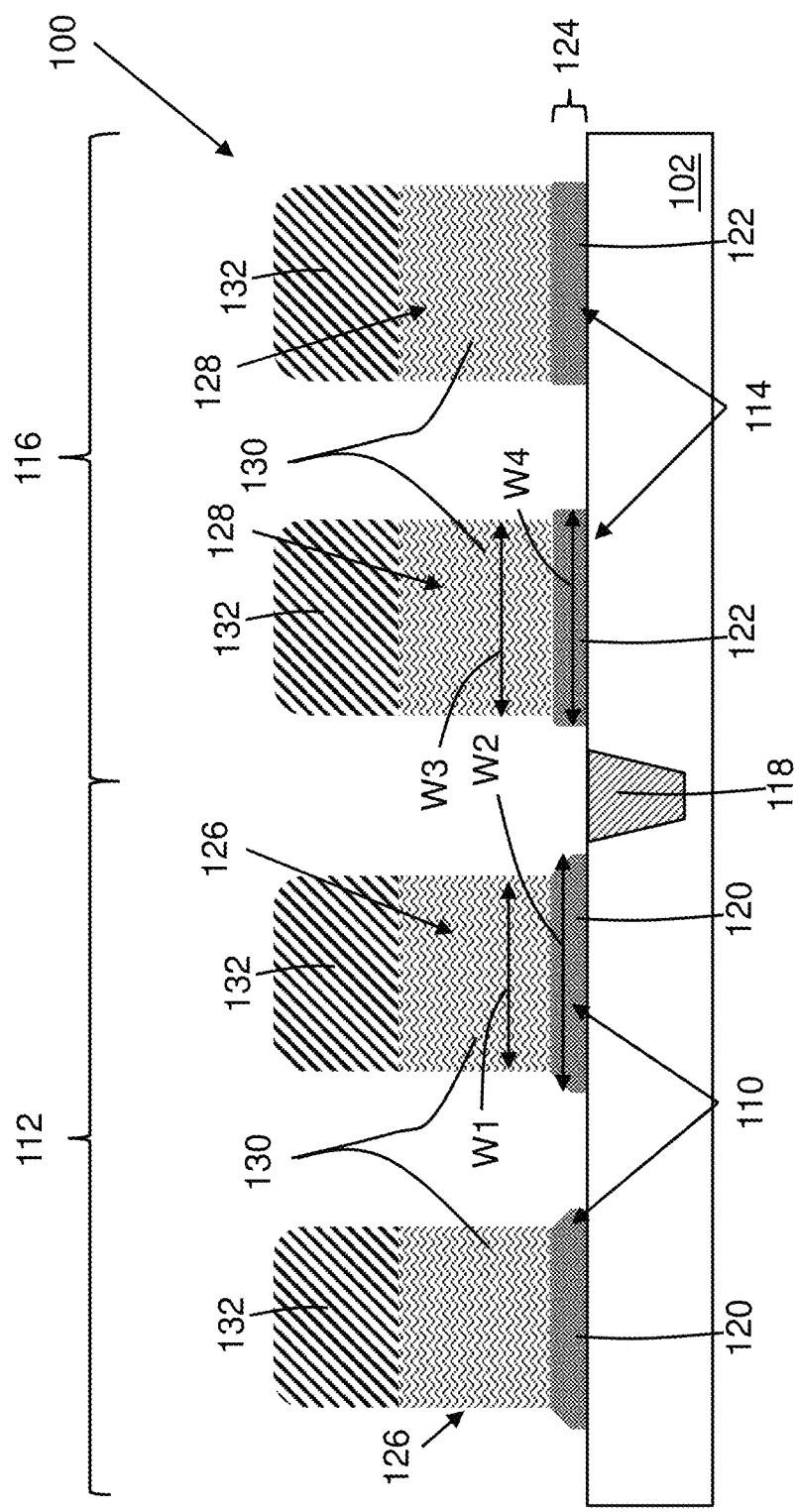
FIG. 2 shows a cross-sectional view of trimming a high-K gate dielectric, according to embodiments of the disclosure.

FIG. 1 shows a cross-sectional view of an initial structure 90 for a method according to embodiments of the disclosure, and FIG. 2 shows a cross-sectional view of a structure 100, according to embodiments of the disclosure. FIGS. 1-2 collectively show embodiments of the method according to the disclosure.

As shown in FIG. 1, initial structure 90 may include a substrate 102. Substrate 102 may include any now known or later developed semiconductor substrate arrangement such as a bulk semiconductor substrate or a semiconductor-on-insulator (SOI) substrate. Substrate 102 may include any appropriate semiconductor material such as but not limited to silicon or silicon germanium. Initial structure also includes at least one first gate structure 110 in a first region 112, and at least one first gate structure 110 in a second region 116. While two first gate structures 110 are shown in each region, any number of first gate structures 110 may be formed for any number of transistors in each region 112, 116. Regions 112, 116 may be any area of substrate 102, and may be electrically isolated from each other, e.g., using a trench isolation 118. Any number of regions 112, 116 may be provided. First gate structures 110 are generally identical and may include any now known or later developed gate arrangement including a high-K gate dielectric 120.

First gate structures 110 may initially be formed using any now known or later developed semiconductor processing technique. For example, first gate structures 110 may be formed by depositing gate dielectric layer(s) 124, and layers of a gate body 126 thereover. Gate dielectric layer 124 may include any now known or later developed high-K material, i.e., dielectric constant>3.9, typically used for gate dielectrics such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as zirconium silicate oxide ($ZrSiO_4$), hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). As will be described herein, in certain embodiments, gate structures may also include an oxide gate dielectric 158 (FIG. 7) between each high-K gate dielectric 120, 122 and substrate 102. Gate body 126 may include any form of gate conductor such as but not limited to: a polysilicon or, as shown, a series of metal layers 130. A gate cap layer 132 may be provided over gate body 126. Metal layers 130 may each include one or more conductive components for providing a gate terminal of a transistor such as a work function metal layer and a gate conductor layer (not separately shown). A work function metal layer may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. A gate conductor layer may include any now known or later developed gate conductor such as copper (Cu).

As shown in FIG. 1, first gate structures 110 are formed by patterning layers 124, 130, 132. The patterning can take any form, e.g., forming a mask, patterning the mask, and etching layers 124, 130, 132, to form first gate structures 110. After first gate structure 110 patterning, layers 130, 132 may have a width W1, and first high-K gate dielectrics 120 may extend out beyond layers 130, 132, to a width W2. The difference in widths is due to the different etching rates of the materials. Hence, first gate body 126 and first high-K gate dielectric 120 have different widths (W1 and W2) defining a width difference, i.e., width W2 minus width W1.

Figure 3:
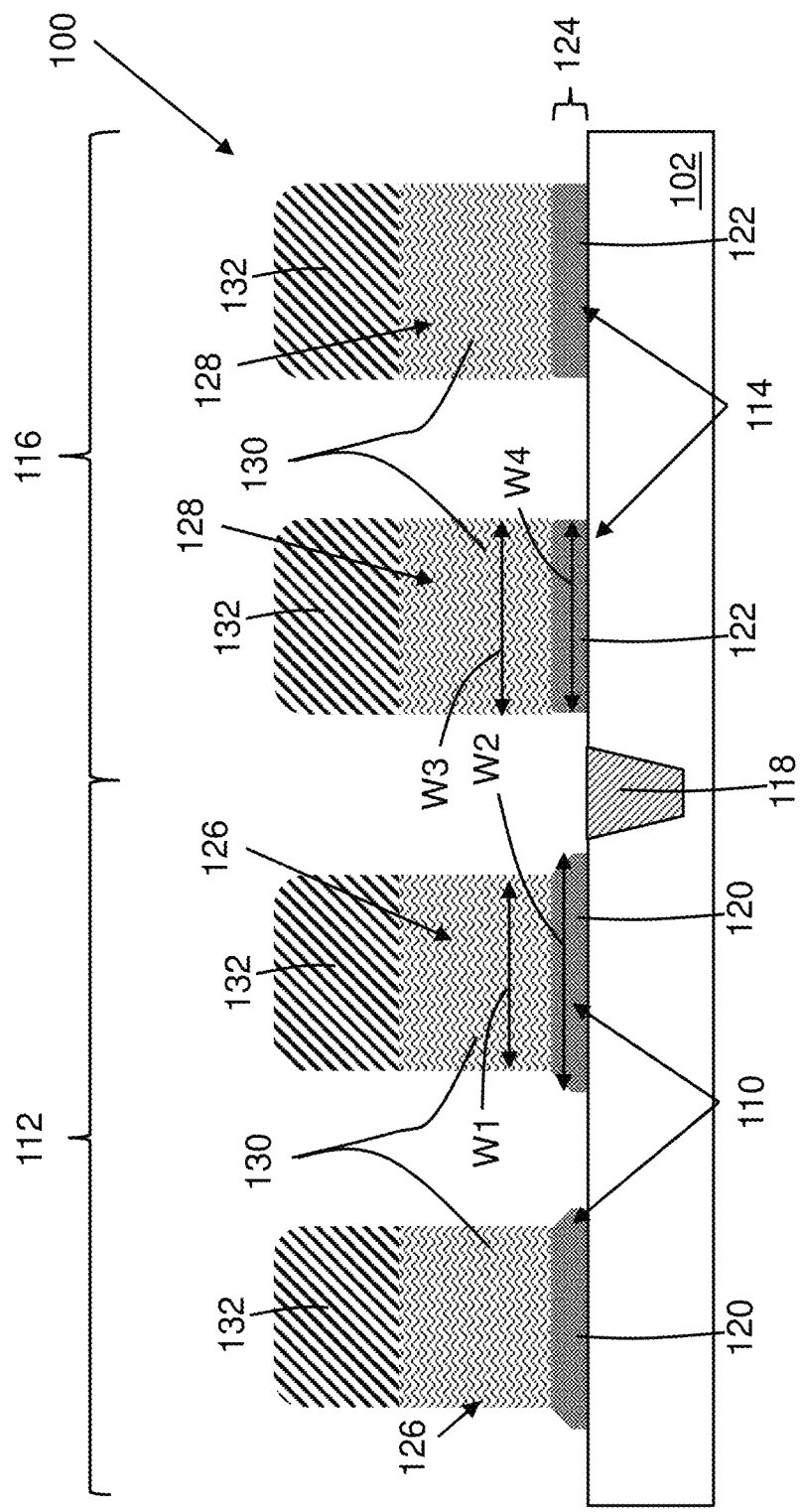
FIG. 3 shows a cross-sectional view of trimming a high-K gate dielectric, according to other embodiments of the disclosure.
Figure 4:
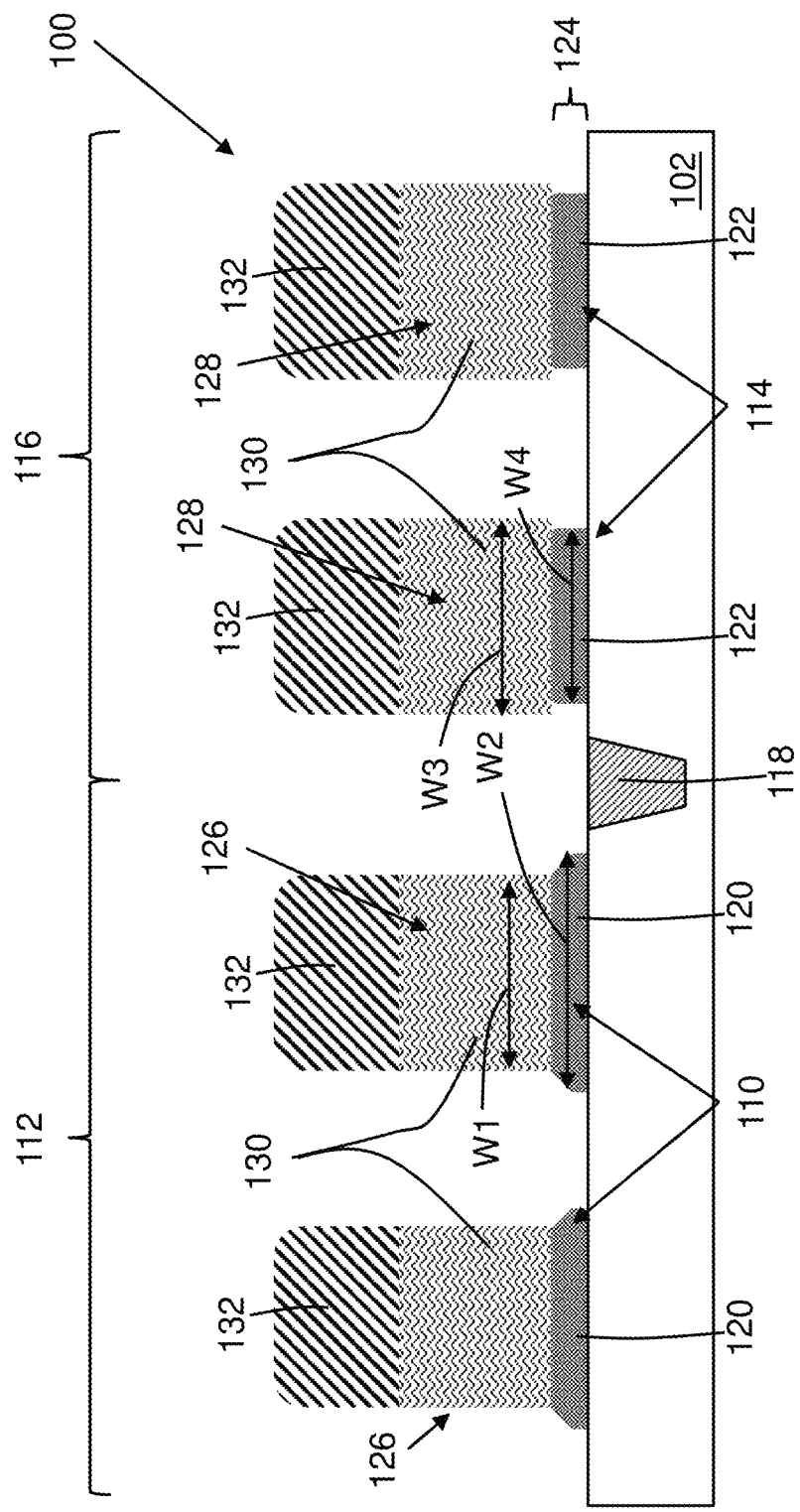
FIG. 4 shows a cross-sectional view of trimming a high-K gate dielectric, according to additional embodiments of the disclosure.

FIGS. 1 and 2 also show forming at least one second gate structure 114 in second region 116 of substrate 102. Second gate structures 114 are formed from first gate structures 110 in second region 116, as shown in FIG. 1. As will be described, first and second gate structures 110, 114 have different width gate dielectrics 120, 122, respectively. In this embodiment, as shown in FIG. 1, the method may include covering at least one first gate structure 110 in first region 112 with a mask 138, leaving at least one first gate structure 110 exposed in second region 116. Mask 138 may include any now known or later developed masking material, e.g., a silicon nitride hard mask or photoresist. Mask 138 may be patterned in any manner, e.g., photolithographic exposure and etching. FIG. 1 also shows etching (arrows) to trim a portion of first high-K gate dielectric 120 from each first gate structure 110 in second region 116, forming at least one second gate structure 114 in second region 116. FIGS. 2-4 show cross-sectional views of the results of the trimming. As shown in FIGS. 2-4, the method may also include removing mask 138 (FIG. 1), e.g., using any appropriate ashing process.

As shown in FIGS. 2-4, the trimming process for first high-K gate dielectric 120 results in second high-K gate dielectric 122 for second gate structures 114 in second region 116 having a width W4 that is less than width W2 of first high-K gate dielectric 120 of first gate structures 110 in first region 112. Also, after the trimming process, layers 130 in second region 116 define a second gate body 128 over second high-K gate dielectric 122. Second gate body 128 for second gate structure 114 has a width W3. As noted, width W4 of second high-K gate dielectric 122 is less than width W2 of first high-K gate dielectric 120 (FIG. 1). The etching process can use any isotropic and/or anisotropic chemistry appropriate for the high-K dielectric material. In one non-limiting example, for $HfO_2$, an ion enhanced chemistry may include, for example, $Cl_2/BCl_3/Ar$, high temperature, electrostatic chuck with low/no bias. Depending on the type of etching used, second gate body 128 may have the same width as first gate body 126. More particularly, a directional etch may etch/trim only first high-K gate dielectric 120. In this case, second gate body 128 width W3 will be generally the same as first gate body 126 width W1, e.g., within a tolerance of the etching process used. Alternatively, a non-directional etch may etch/trim first gate body 126 and first high-K gate dielectric 120. In this case, second gate body 128 width W3 will be less than first gate body 126 width W1. In any event, second gate body 128 and second high-K gate dielectric 122 have different widths (W3 and W4) defining a second width difference, i.e., width W4 minus width W3. Due to first region 112 being covered during the trimming, the first width difference between first gate body 126 and first high-K gate dielectric 120 (i.e., W2–W1) is different than second width difference between second gate body 128 and second high-K gate dielectric 122 (i.e., W4–W3).

The etching process can be controlled to control the amount of first high-K gate dielectric 120 that is removed to form second high-K gate dielectric 122 for second gate structures 114 in second region 116. In any event, at least 1 nanometer of width is removed from each first high-K dielectric 120. As shown in FIG. 2, the etching process may etch a relatively small amount such that width W4 of second high-K gate dielectric 122 of second gate structure(s) 114 remains wider than width W3 of second gate body 128. As shown in FIG. 3, the etching process may etch an amount such that second high-K gate dielectric 122 of second gate structure(s) 114 has a width W4 that is similar to width W3 of second gate body 128, but is still different. As shown in FIG. 4, the etching process may over-etch an amount such that second high-K gate dielectric 122 of second gate structure(s) 114 has width W4 that is smaller than width W3 of second gate body 128. In this manner, an overlap capacitance ($C_{ov}$) of transistors 152 (FIG. 5) formed with second gate structures 114 in second region 116 can be precisely controlled.

Figure 5:
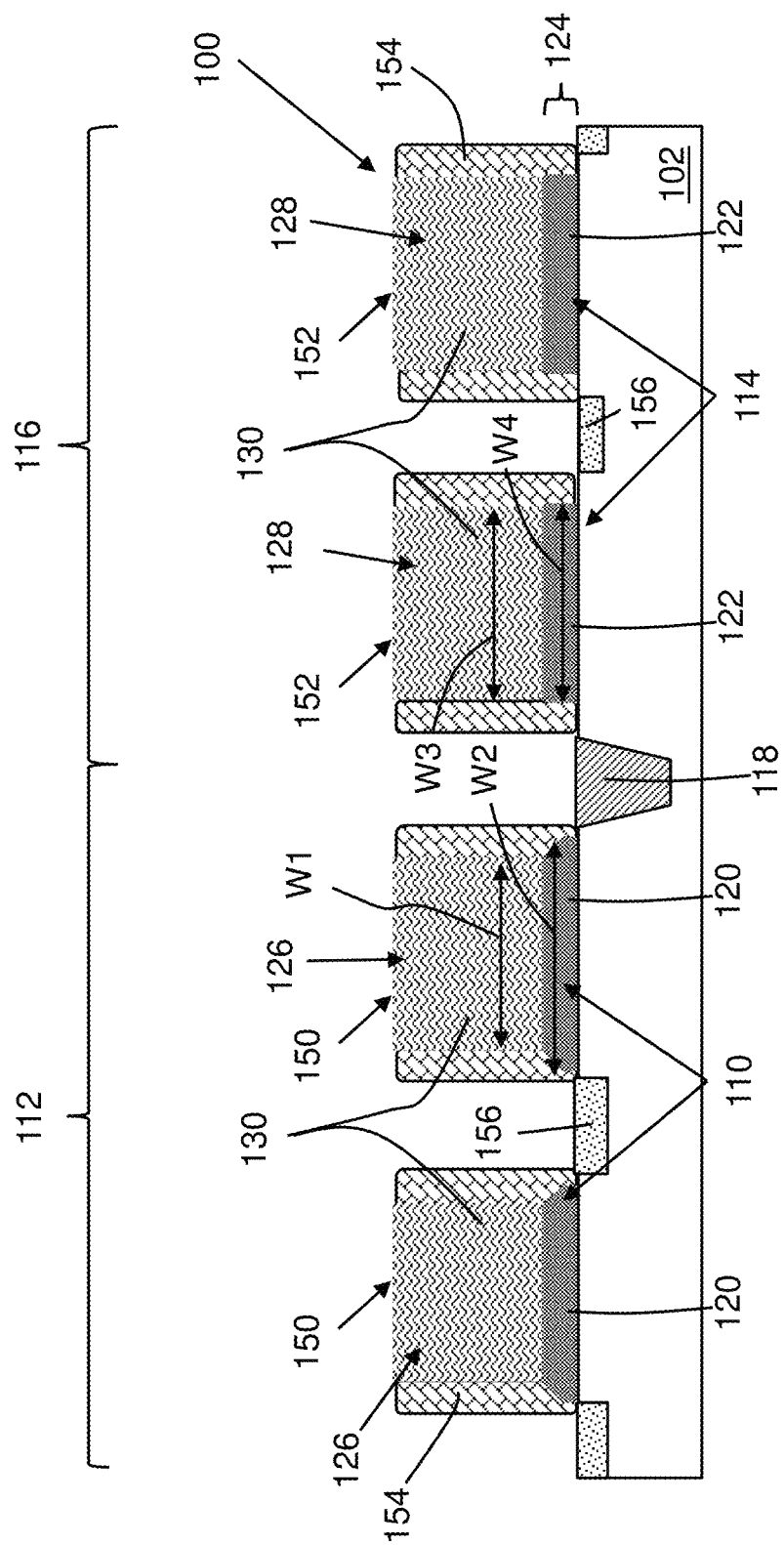
FIG. 5 shows a cross-sectional view of forming transistors and a structure, according to embodiments of the disclosure.

As shown in FIG. 5, the method may further include any now known or later developed semiconductor processing to form at least one first transistor 150 in first region 112, and at least one second transistor 152 in second region 116, i.e., from first and second gate structures 110, 114, respectively.

Figure 6:
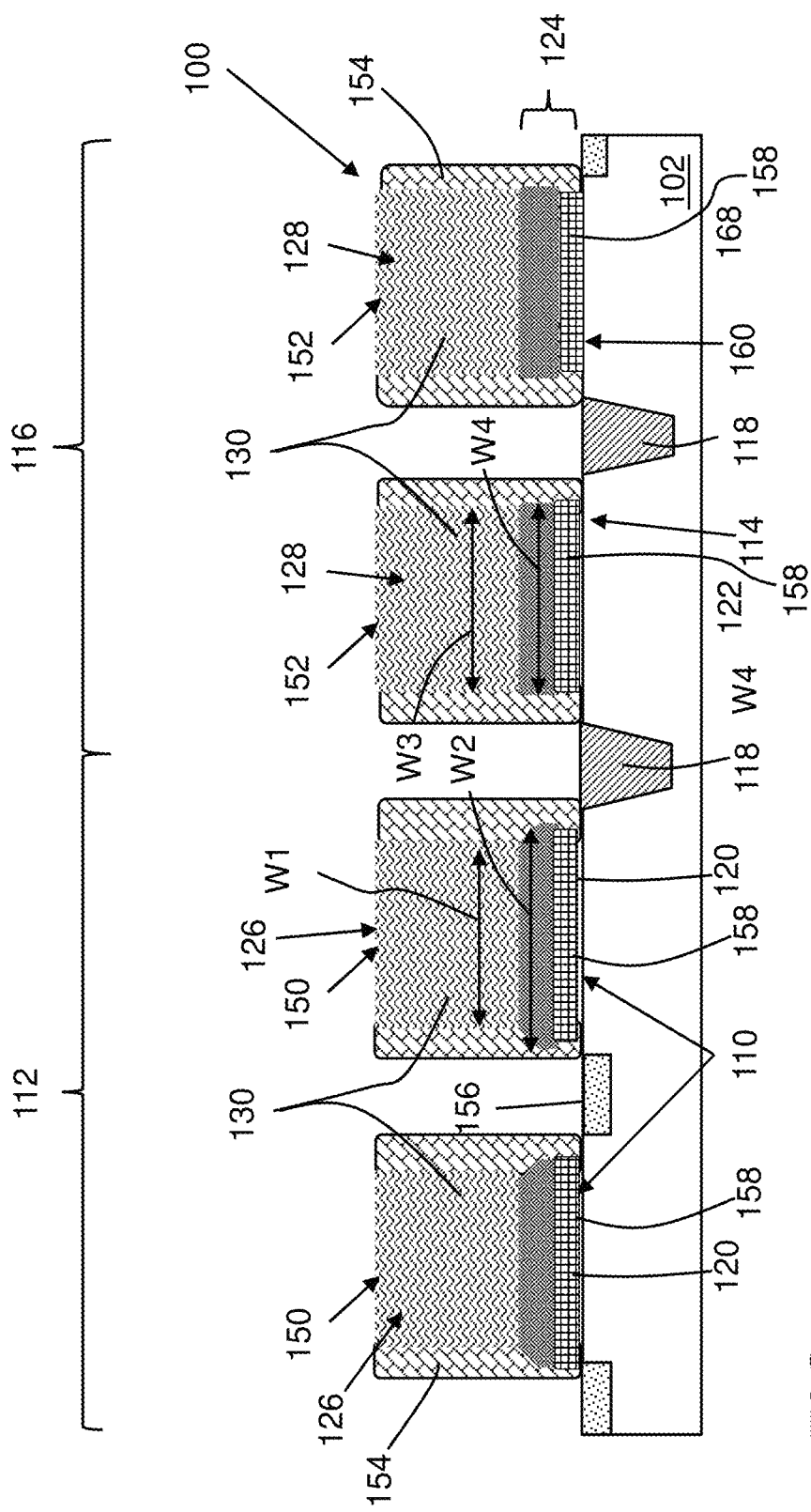
FIG. 6 shows a cross-sectional view of a structure including a high-K gate dielectric and an oxide gate dielectric, according to other embodiments of the disclosure.
Figure 7:
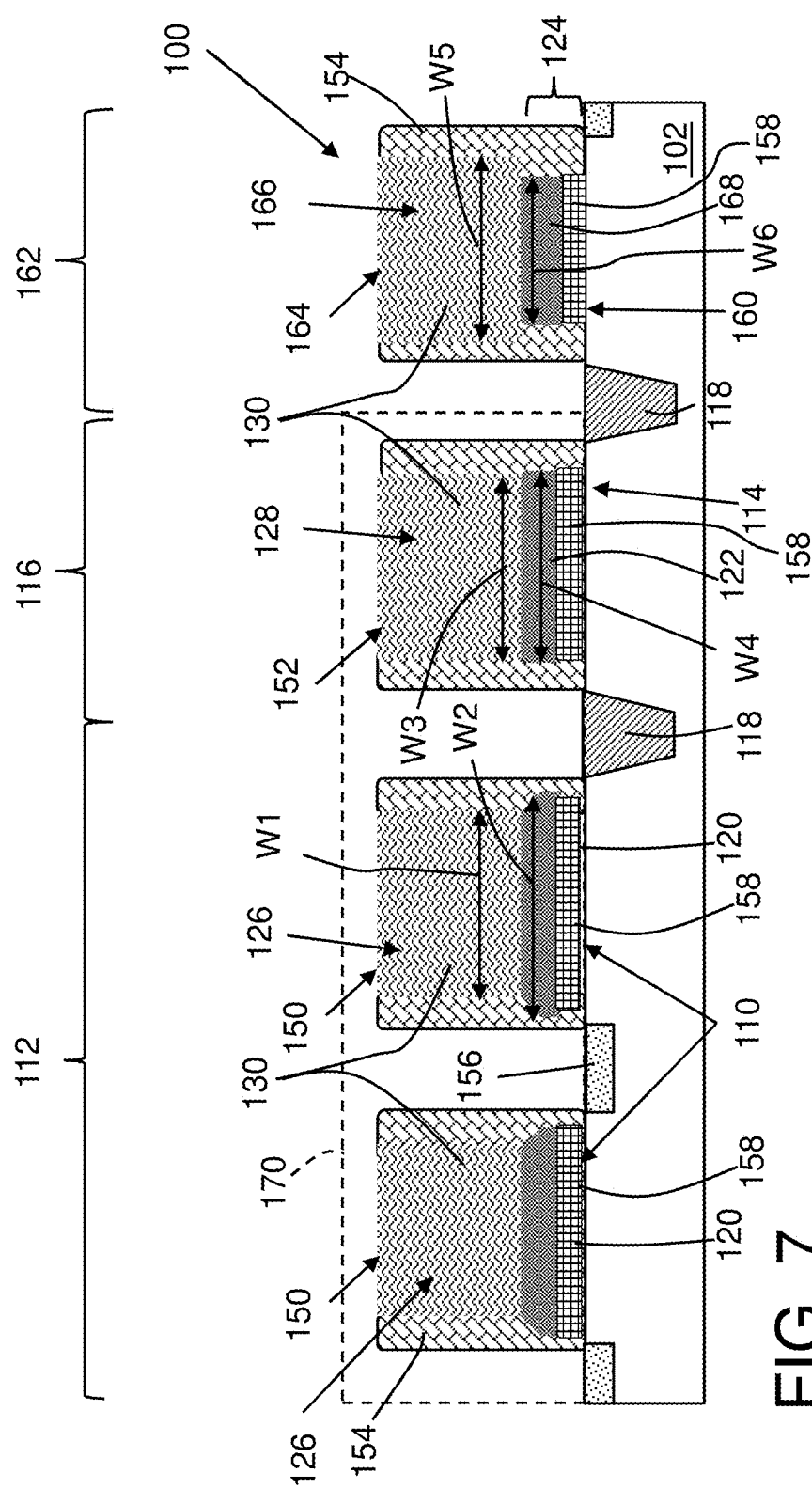
FIG. 7 shows a cross-sectional view of forming transistors and a structure, according to other embodiments of the disclosure.

In one non-comprehensive and non-limiting example, processing may include formation of spacer layer 154 surrounding a sidewall of gate structures 110, 114, formation of source/drain regions 156, and formation of any interconnect layers (not shown) (contact and/or metal layers). Spacer layer 154 may include any now known or later developed spacer material such as a nitride, e.g., silicon nitride. As shown in FIGS. 5-7, cap layer 132 may be removed in any known fashion, e.g., etching, and spacer layer 154 may be formed on sidewalls of gate bodies 126, 128, e.g., by deposition of spacer material like silicon nitride, and etching. Source/drain regions 156 may include any appropriate dopants for the type of transistor being formed.

As a result of the method, as shown in FIG. 5, structure 100 includes first region 112 including at least one first transistor 150 on substrate 102 with first transistor(s) 150 having first gate structure 110 having first gate body 126 over first high-K gate dielectric 120. First gate body 126 and first high-K gate dielectric 120 have different widths, W1 and W2, respectively, defining a width difference, i.e., W2-W1. Structure 100 also includes second region 116 including at least one second transistor 152 on substrate 102 with second transistor(s) 152 having second gate structure 114 having second gate body 128 over second high-K gate dielectric 122. Second gate body 128 and second high-K gate dielectric 122 have different widths, W3 and W4, respectively, defining a width difference, i.e., W4-W3. The first width difference between first gate body 126 and first high-K gate dielectric 120 (i.e., W2-W1) for transistors 150 in first region 112 is different than the second width difference between second gate body 128 and second high-K gate dielectric 122 (i.e., W4-W3) for transistors 152 in second region 116.

FIG. 6 shows a cross-sectional view of a structure including a high-K gate dielectric 120, 122 and an oxide gate dielectric 158, according to other embodiments of the disclosure. FIG. 6 shows embodiments in which structure 100 includes oxide gate dielectric 158 positioned between each high-K gate dielectric 120, 122 and substrate 102. Oxide gate dielectric 158 may include any oxide-based dielectric appropriate for gate dielectrics, e.g., silicon oxide. The method may include forming oxide gate dielectric 158 between each high-K gate dielectric, e.g., 120, 122, and substrate 102, by for example, depositing a layer of oxide before forming high-K dielectric layer 124 (FIG. 1), and then exposing it to the same patterning as described herein to form gate structures 110, 114. Hence, oxide gate dielectric 158 may be sized in the same manner as described relative to first and/or second high-K gate dielectric 120, 122. An oxide gate dielectric 158 may be employed in an extra gate (EG) transistor setting, e.g., in higher voltage applications such as input/output transistors. While shown in both regions, oxide gate dielectric 158 may be used in one or more regions.

FIG. 7 shows a cross-sectional view of forming transistors and a structure, according to additional embodiments. As shown in FIG. 7, the method may optionally include forming at least one third gate structure 160 in at least one third region 162 on substrate 102. Each third region 162 includes at least one third transistor 164 on substrate 102. That is, third gate structure(s) 160 may be used to form transistor(s) 164 in each third region 162, similarly as described herein relative to transistors 150, 152. Third transistor(s) 164 in a selected third region 162 have third gate structure 160 having a third gate body 166 over a third high-K gate dielectric 168. Third gate body 166 and third high-K gate dielectric 168 have different widths (i.e., W5 and W6, respectively) defining a third width difference, i.e., W6-W5. The first width difference, the second width difference and the third width difference all may be different from each other. That is, first width difference between first gate body 126 and first high-K gate dielectric 120 (i.e., W2−W1), second width difference between second gate body 128 and second high-K gate dielectric 122 (i.e., W4−W3), and a third width difference between third gate body 166 and third high-K gate dielectric 168 (i.e., W6−W5) all may be unique. In this manner, any number of regions 112, 116, 162 can be provided, each with transistors having different width differences between high-K gate dielectrics and gate bodies thereof, and different overlap capacitances ($C_{ov}$). Third region(s) 162 may be formed by forming a mask 170 (dashed line box) over first region 112 and second region 116, and etching as described previously herein. Depending on the etch processes used to trim high-K gate dielectrics 122, 168, as previously described, first gate body 126, second gate body 128 and each third gate body 166 may have a same width, i.e., W1=W3=W5. Any number of each of the regions 112, 116, 162 can be employed on the same substrate 102.

Figure 8:
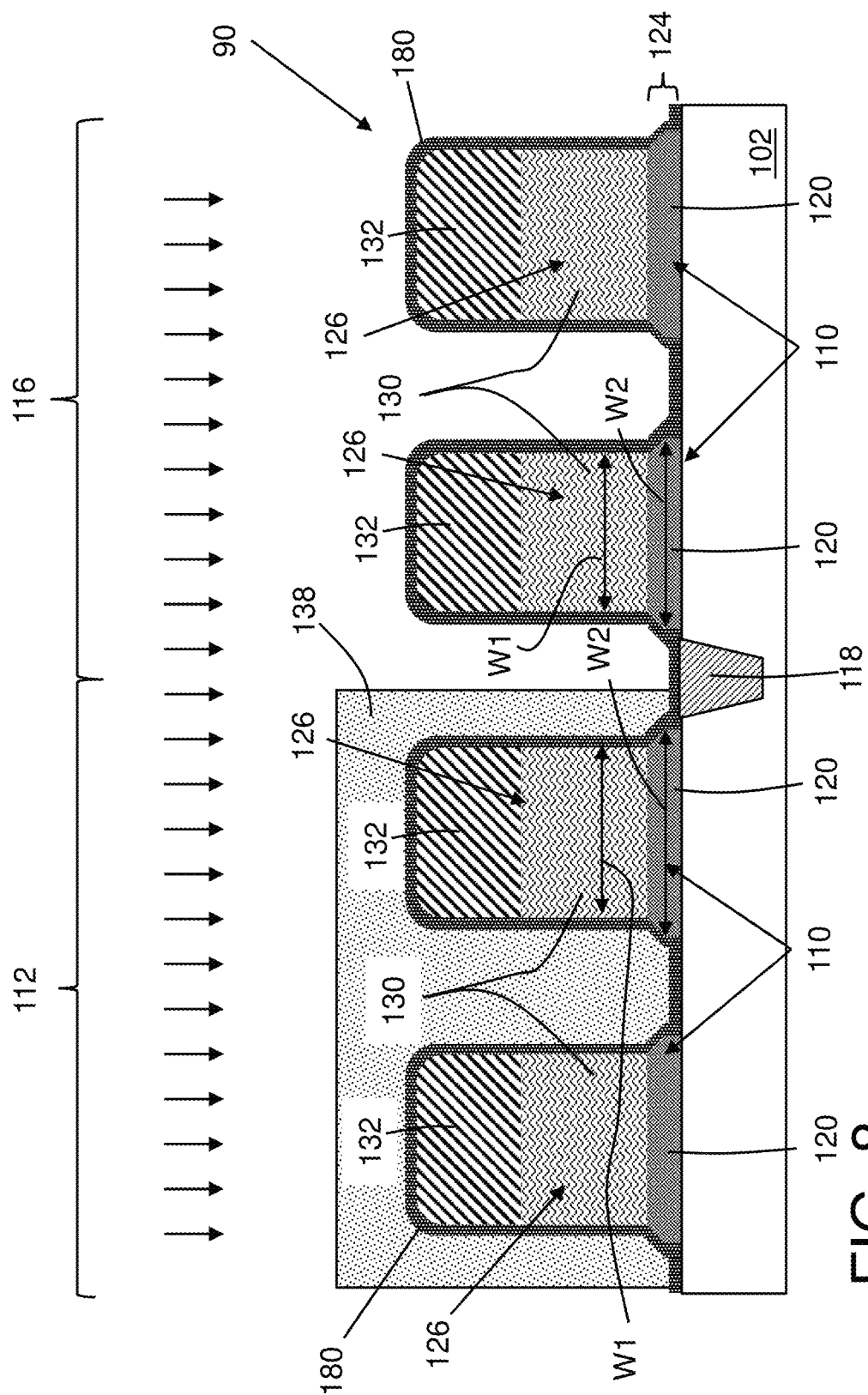
FIG. 8 shows a cross-sectional view of an initial structure for a method including a spacer layer about gate structures, according to other embodiments of the disclosure.

Referring to FIGS. 8-11, another embodiment of the method is illustrated. FIG. 8 shows a cross-sectional view of an initial structure for a method including a spacer layer about gate structures, similar to FIG. 1, but according to other embodiments of the disclosure. At this stage of forming at least one first gate structure 110 and at least one second gate structure 114 (FIG. 9), the at least one first gate structure 110 has been formed in a plurality of regions of substrate 102 including first region 112 and second region 116. In addition to the processes described relative to FIG. 1, embodiments such as the example in FIG. 8 also include forming a first spacer layer 180 surrounding a sidewall of gate bodies 126, i.e., surrounding a sidewall of each first gate structure 110 in all of the plurality of regions of substrate 102. First spacer layer 180 may include any now known or later developed spacer material such as a nitride, e.g., silicon nitride, and may be formed using any now known process, e.g., deposition and etching to shape the layer.

Figure 9:
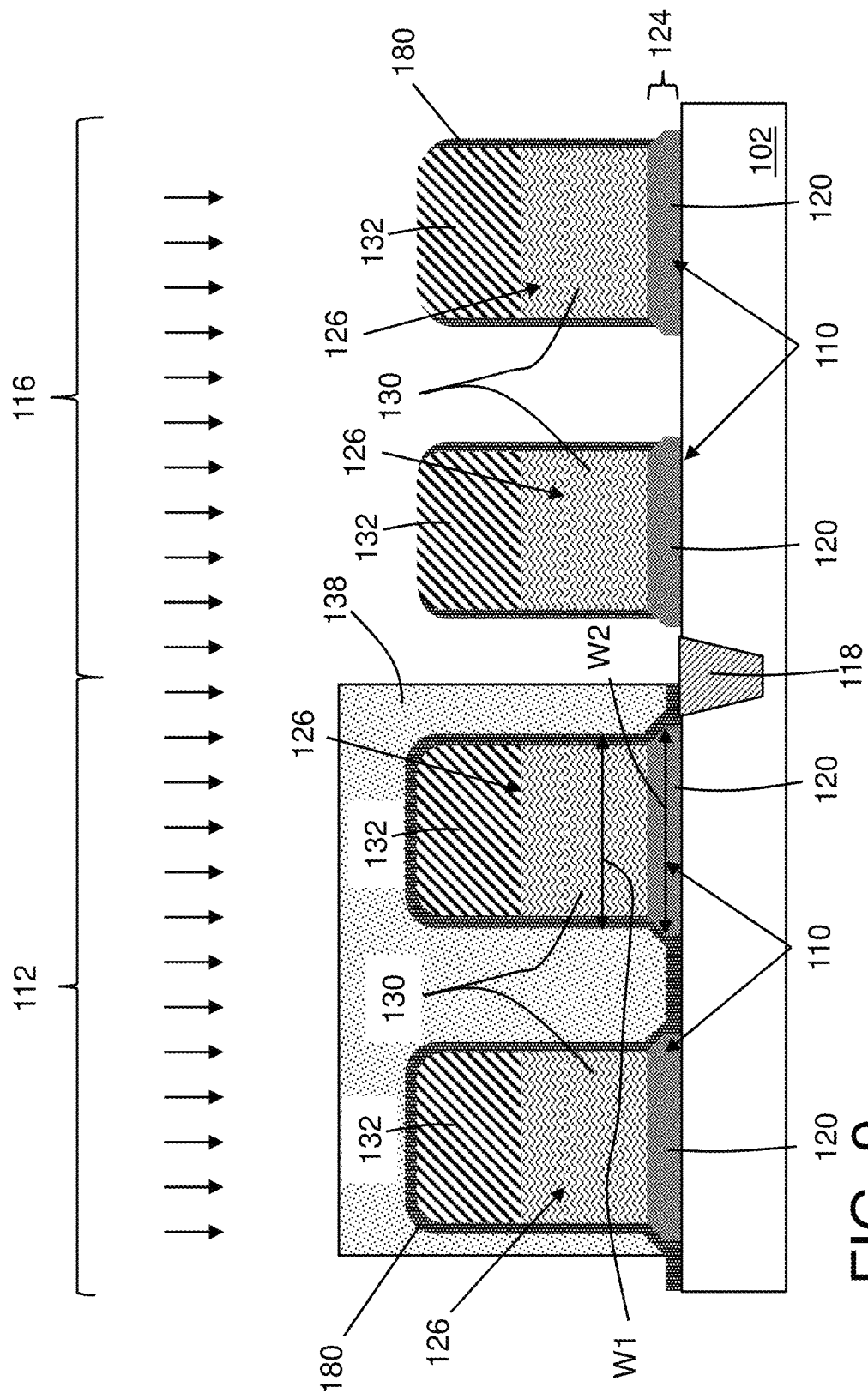
FIG. 9 shows a cross-sectional view of removing a spacer layer from at least a high-K gate dielectric of the gate structures, according to other embodiments of the disclosure.
Figure 10:
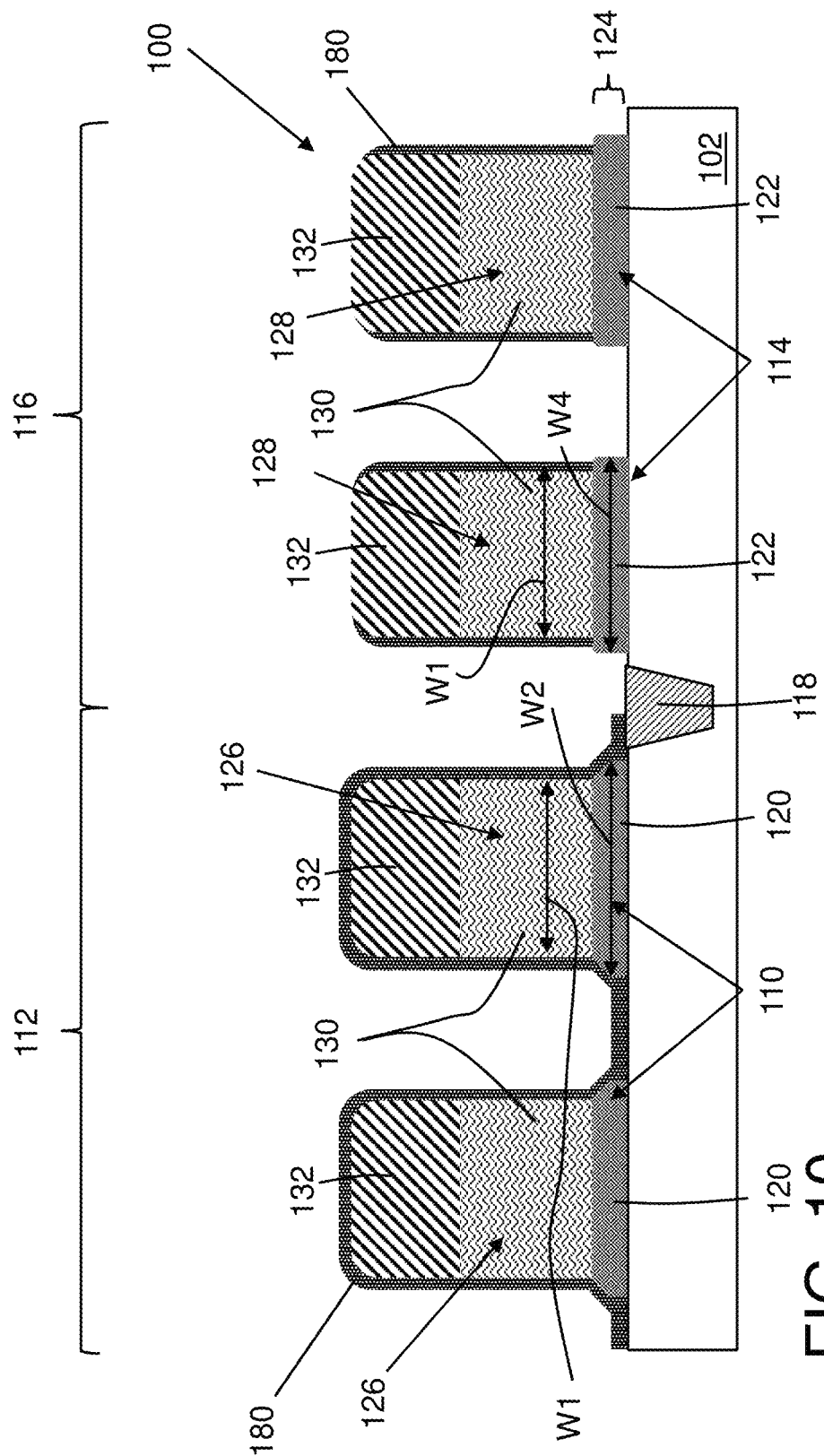
FIG. 10 shows a cross-sectional view of trimming a high-K gate dielectric, according to other embodiments of the disclosure.

FIGS. 9-10 show cross-sectional views of forming at least one second gate structure 114 (FIG. 10) in second region 116 (FIG. 10) of substrate 102. Second gate structures 114 are formed from first gate structures 110 in second region 116, as shown in FIG. 8. As will be described, first and second gate structures 110, 114 have different width high-K gate dielectrics 120, 122, respectively. In this embodiment, as shown in FIG. 8, the method may include covering at least one first gate structure 110 in first region 112 with mask 138, leaving at least one first gate structure 110 exposed in second region 116. Mask 138 may include any now known or later developed masking material, e.g., a silicon nitride hard mask or photoresist. Mask 138 may be patterned in any manner, e.g., photolithographic exposure and etching.

As shown in FIGS. 8 and 9, the method may include etching (arrows in FIG. 8) to remove first spacer layer 180 from at least first high-K dielectric 120 of each first gate structure 110 in second region 116. Any appropriate etching process for the material of first spacer layer 180 may be used, e.g., a reactive ion etch. First spacer layer 180 remains on sidewalls of first gate body 126 of first gate structures 110 in second region 116 and may be slightly thinner compared to its original thickness. First spacer layer 180 protects first gate bodies 126 in second region 116 from the etch, retaining their width W1 (FIG. 8). First spacer layer 180 may also be removed from an upper surface of first gate structure(s) 110 in second region 116, e.g., from cap layer 132 of each first gate structure 110. First spacer layer 180 in first region 112 is protected by mask 138 and is unchanged.

FIG. 10 shows a cross-sectional view of etching (arrows) to trim a portion of first high-K gate dielectric 120 from each first gate structure 110 in second region 116, forming at least one second gate structure 114 in second region 116. The method may also include removing mask 138 (FIG. 9), e.g., using any appropriate ashing process. As previously described, the trimming process for first high-K gate dielectric 120 results in second high-K gate dielectric 122 for second gate structures 114 in second region 116 having a width W4 that is less than width W2 of first high-K gate dielectric 120 of first gate structures 110 in first region 112. Also, after the trimming process, layer(s) 130 in second region 116 define second gate body 128 over second high-K gate dielectric 122. First spacer layer 180 protects first gate bodies 126 in second region 116 from the etch, retaining their width W1 (FIG. 8). Hence, second gate body 128 for second gate structure 114 has width W1, and as noted, second high-K gate dielectric 122 has a width W4. As noted, width W4 of second high-K gate dielectric 122 is less than width W2 of first high-K gate dielectric 120 (FIG. 1). The etching process can use any isotropic and/or anisotropic chemistry appropriate for the high-K dielectric material. In one non-limiting example, for $HfO_2$, an ion enhanced chemistry may include, for example, $Cl_2/BCl_3/Ar$, high temperature, electrostatic chuck with low/no bias. In this embodiment, regardless of the type of etching used to trim first high-K gate dielectric 120 (FIG. 9), second gate body 128 will have the same width W1 as first gate body 126 because of the presence of first spacer layer 180. In any event, second gate body 128 and second high-K gate dielectric 122 have different widths (W1 and W4) defining a second width difference, i.e., width W4 minus width W1. Due to first region 112 being covered during the trimming, the first width difference between first gate body 126 and first high-K gate dielectric 120 (i.e., W2−W1) is different than second width difference between second gate body 128 and second high-K gate dielectric 122 (i.e., W4−W1).

As noted, the etching process can be controlled to control the amount of first high-K gate dielectric 120 that is removed to form second high-K gate dielectric 122 for second gate structures 114 in second region 116. In any event, at least 1 nanometer of width is removed from each first high-K dielectric 120. The amount of etching performed may track that shown relative to FIGS. 2-5, and hence, illustrations of the process will not be repeated here. FIG. 10 shows etching similar to that shown in FIG. 2. In any event, an overlap capacitance ($C_{ov}$) of transistors 152 (FIG. 11) formed with second gate structures 114 in second region 116 can be controlled.

Figure 11:
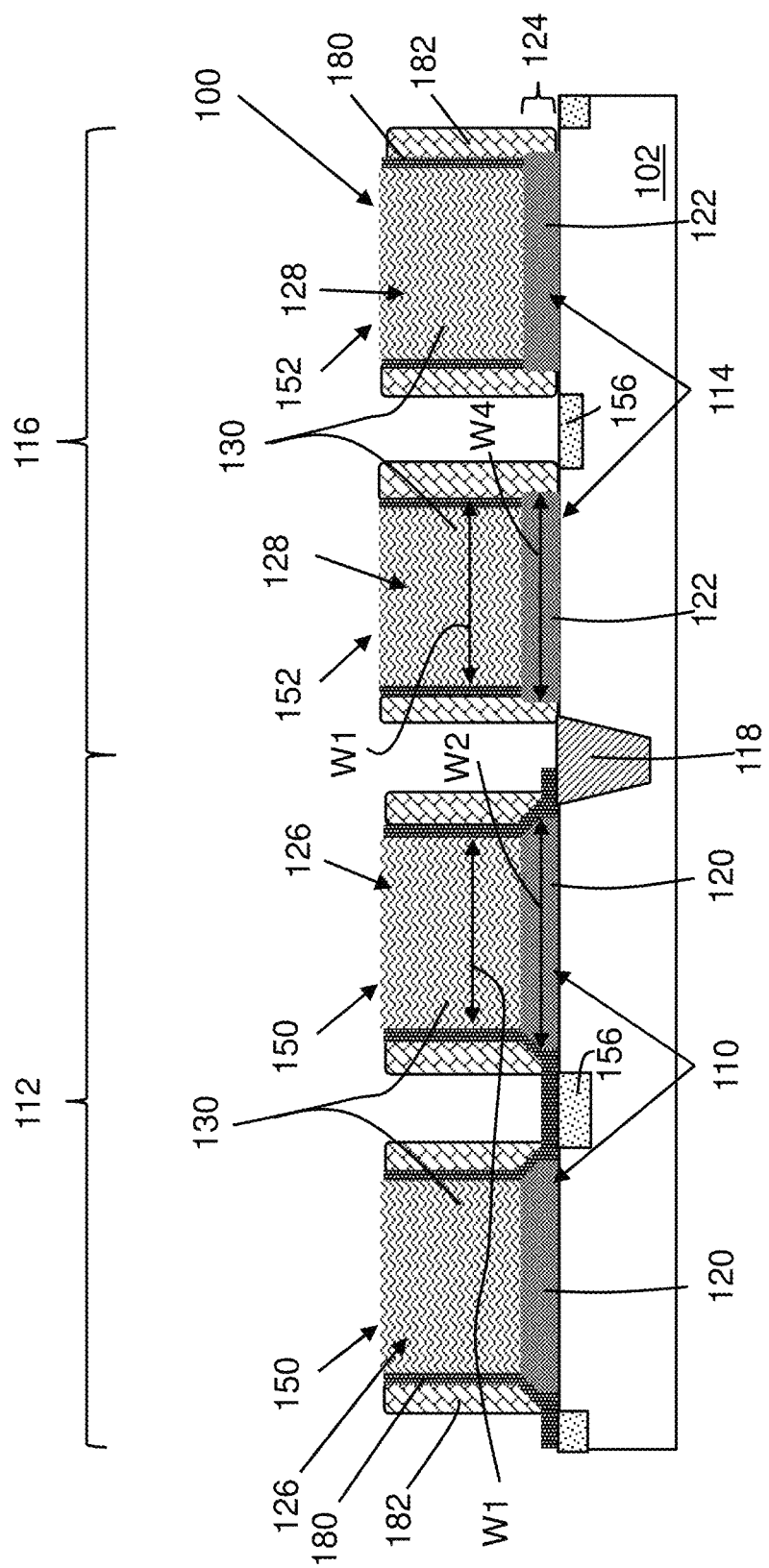
FIG. 11 shows a cross-sectional view of forming transistors and a structure, according to other embodiments of the disclosure.

As shown in FIG. 11, the method may further include any now known or later developed semiconductor processing to form at least one first transistor 150 in first region 112, and at least one second transistor 152 in second region 116, i.e., from first and second gate structures 110, 114, respectively. In one non-comprehensive and non-limiting example, processing may include formation of a second spacer layer 182 over first spacer layer 180 and surrounding sidewalls of gate structures 110, 114, formation of source/drain regions 156, removal of cap layer 132 (FIG. 10), and formation of any interconnect layers (not shown) (contact and/or metal layers). Second spacer layer 182 may include any now known or later developed spacer material such as a nitride, e.g., silicon nitride. Source/drain regions 156 may include any appropriate dopants for the type of transistor being formed.

Spacer layer 180 is on a sidewall of gate bodies 126, 128, and spacer layer 182 is on a sidewall of spacer layer 180.

As a result of the method, as shown in FIG. 11, structure 100 includes first region 112 including at least one first transistor 150 on substrate 102 with first transistor(s) 150 having first gate structure 110 having first gate body 126 over first high-K gate dielectric 120. First gate body 126 and first high-K gate dielectric 120 have different widths, W1 and W2, respectively, defining a width difference, i.e., W2-W1. Structure 100 also includes second region 116 including at least one second transistor 152 on substrate 102, with second transistor(s) 152 having second gate structure 114 having second gate body 128 over second high-K gate dielectric 122. Second gate body 128 and second high-K gate dielectric 122 have different widths, W1 and W4, respectively, defining a width difference, i.e., W4-W1. The first width difference between first gate body 126 and first high-K gate dielectric 120 (i.e., W2−W1) for transistors 150 in first region 112 is different than the second width difference between second gate body 128 and second high-K gate dielectric 122 (i.e., W4−W1) for transistors 152 in second region 116.

As shown in FIG. 7, structure 100 can include substrate 102, and a plurality of regions 112, 116, 162 on substrate 102. Each region 112, 116, 162 may include at least one transistor 150, 152, 164 on substrate 102, each transistor 150, 152, 164 in a selected region 112, 116, 162 has a gate structure 110, 114, 160 having gate body 126, 128, 166 over high-K gate dielectric 120, 122, 168. Gate bodies 126, 128, 166 and respective high-K gate dielectrics 120, 122, 168 have different widths defining respective width differences. As described, the width difference is different for the respective at least one transistor 150, 152, 164 in each region 112, 116, 162 of the plurality of regions.

In another embodiment, per the FIGS. 8-11 method, first gate structure 110 in first region 112 and second gate structure 114 in second region 116 each include a gate body 126, 128 over a respective high-K dielectric 120, 122, respectively. Each gate body 126, 128 has first spacer layer 180 surrounding a sidewall of the respective gate body (i.e., a sidewall thereof) and a second spacer layer 182 surrounding a sidewall of the first spacer layer 180. While not shown, the teachings illustrated relative to FIGS. 6 and 7 can also be applied to the FIGS. 8-11 embodiments.

Transistors 150, 152, 164 described herein may be used for any appropriate application. In one example, at least one first transistor 150 may include an input/output transistor, perhaps as an extra gate (EG) device with oxide gate dielectric 158 (FIG. 7), such as those used in high voltage settings. Second transistor(s) 152 and/or third transistor(s) 164 with smaller high-K gate dielectric 122, 168 than first high-K gate dielectric 120 may include a logic transistor, such as those used in static random-access memory (SRAM) applications. Other applications of the various transistors 150, 152, 164, are also possible.

Embodiments of the disclosure provide various technical and commercial advantages, examples of which are discussed herein. Different high-K gate dielectric widths affect the electrical parameters of a respective transistor. For example, the different gate dielectric widths in the different regions allow for better control of overlap capacitance of the different transistors without increasing dopants or an annealing temperature therefor. Two or more different widths of high-K gate dielectrics may be used to control overlap capacitance ($C_{ov}$) of transistors in different regions of the same substrate. Additional doping and/or increased temperatures for driving in the dopants is not required.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:
   a substrate;
   a first region including at least one first transistor on the substrate, the at least one first transistor having a first gate structure having a first gate body over a first high dielectric constant (high-K) gate dielectric, wherein the first gate body has a first body width and the first high-K gate dielectric has a first dielectric width extending horizontally beyond the first gate body, the different widths defining a first width difference;
   a second region including at least one second transistor on the substrate, the at least one second transistor having a second gate structure having a second gate body over a second high-K gate dielectric, wherein the second gate body has a second body width and the second high-K gate dielectric has a second dielectric width extending horizontally beyond the second gate body, the different widths defining a second width difference; and
   a third region including at least one third transistor on the substrate, the at least one third transistor having a third gate structure having a third gate body over a third high-K gate dielectric, wherein the third gate body has a third body width and the third high-K gate dielectric has a third dielectric width extending horizontally beyond the third gate body, the different widths defining a third width difference,
   wherein the first width difference, the second width difference and the third width difference are all different and the first body width, the second body width and each third body width are the same.

2. The structure of claim 1, further comprising an oxide gate dielectric between each high-K gate dielectric and the substrate.

3. The structure of claim 1, wherein the first gate body and the second gate body each include a first spacer layer surrounding a sidewall of the respective gate body and a second spacer layer surrounding a sidewall of the first spacer layer, and wherein the first gate body of the first gate structure includes the first spacer layer over an upper surface thereof.

4. The structure of claim 1, wherein the at least one first transistor includes an input/output transistor and the at least one second transistor includes a logic transistor.

5. A structure, comprising:
   a substrate; and
   three or more regions on the substrate, each region including at least one transistor on the substrate, every transistor in each of the three or more regions having a gate structure having a gate body over a high dielectric constant (high-K) gate dielectric, wherein the gate body has a body width and the high-K gate dielectric has a dielectric width extending horizontally beyond the gate body, a width offset between the body width and the dielectric width defining a width difference, and
   wherein the width difference is different for the respective at least one transistor in each region of the three or more plurality of regions and each body width in the three or more regions are the same.

6. The structure of claim 5, further comprising an oxide gate dielectric between each high-K gate dielectric and the substrate.

7. The structure of claim 5, wherein a first gate structure in a first region and a second gate structure in a second region each include a gate body over a respective high-K dielectric, each gate body having a first spacer layer surrounding a sidewall of the gate body and a second spacer layer surrounding a sidewall of the first spacer layer.

8. The structure of claim 5, wherein at least one transistor in one region of the plurality of regions includes an input/output transistor and at least one transistor in another region of the plurality of regions includes a logic transistor.

9. A method, comprising:
   forming at least one first gate structure in a first region of a substrate, each first gate structure having a first gate body over a first high dielectric constant (high-K) gate dielectric, wherein the first gate body has a first body width and the first high-K gate dielectric has a first dielectric width extending horizontally beyond the first gate body, the different widths defining a first width difference;
   forming at least one second gate structure in a second region of the substrate, each second gate structure having a second gate body over a second high-K gate dielectric, wherein the second gate body has a second body width and the second high-K gate dielectric has a second dielectric width extending horizontally beyond the second gate body, the different widths defining a second width difference; and
   forming at least one third gate structure in at least one third region on the substrate, each third gate structure in a respective third region having a third gate body over a third high-K gate dielectric, wherein the third gate body has a third body width and the third high-K gate dielectric has a third dielectric width extending horizontally beyond the third gate body, the different widths defining a third width difference,
   wherein the first width difference, the second width difference and the third width difference are all different and the first body width, the second body width and each third body width are the same.

10. The method of claim 9, wherein forming the at least one first gate structure and the at least one second gate structure includes:
    forming the at least one first gate structure in the first region and the second region of the substrate;
    covering the at least one first gate structure in the first region, leaving the at least one first gate structure exposed in the second region;
    etching to trim a portion of the first high-K gate dielectric from each first gate structure in the second region, forming the at least one second gate structure in the second region; and
    removing the covering.

11. The method of claim 9, further comprising forming an oxide gate dielectric between each high-K gate dielectric and the substrate.

12. The method of claim 9, wherein forming the at least one first gate structure and the at least one second gate structure includes:
    forming the at least one first gate structure in a plurality of regions of the substrate including a first region and a second region;
    forming a first spacer layer surrounding a sidewall of each first gate structure in all of the plurality of regions of the substrate;
    covering the at least one first gate structure in the first region, leaving the at least one first gate structure exposed in the second region;
    etching to remove the first spacer layer from at least the first high-K dielectric of each first gate structure in the second region;

etching to trim a portion of the first high-K gate dielectric from each first gate structure in the second region, forming the at least one second gate structure in the second region; and removing the covering.

13. The method of claim 12, further comprising forming a second spacer layer over the at first spacer layer.

14. The method of claim 13, wherein etching to remove the first spacer layer removes the first spacer layer from an upper surface of the second gate body of the at least one second gate structure.

* * * * *

UNITED STATES PATENT AND TRADEMARK OFFICE
CERTIFICATE OF CORRECTION

| | | |
|---|---|---|
| PATENT NO. | : 12,433,014 B2 | Page 1 of 1 |
| APPLICATION NO. | : 17/658914 | |
| DATED | : September 30, 2025 | |
| INVENTOR(S) | : Anton V. Tokranov et al. | |

It is certified that error appears in the above-identified patent and that said Letters Patent is hereby corrected as shown below:

In the Claims

In Claim 5, Column 11, Line 59 reads "...more plurality of regions and each body width in the"..." but it should read "more regions and each body width in the"......"

Signed and Sealed this
Twenty-eighth Day of October, 2025

John A. Squires
*Director of the United States Patent and Trademark Office*